(12) United States Patent
Rao et al.

(10) Patent No.: US 7,704,830 B2
(45) Date of Patent: Apr. 27, 2010

(54) SPLIT GATE MEMORY CELL USING SIDEWALL SPACERS

(75) Inventors: Rajesh A. Rao, Austin, TX (US);
Tushar P. Merchant, Austin, TX (US);
Ramachandran Muralidhar, Austin, TX (US); Lakshmanna Vishnubhotla, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 410 days.

(21) Appl. No.: 11/759,518

(22) Filed: Jun. 7, 2007

(65) Prior Publication Data

US 2008/0303067 A1    Dec. 11, 2008

(51) Int. Cl.
*H01L 21/336* (2006.01)
(52) U.S. Cl. .................. 438/257; 438/259; 438/265; 257/E21.68
(58) Field of Classification Search ......... 438/257–270; 257/E21.68
See application file for complete search history.

(56) References Cited

U.S. PATENT DOCUMENTS

| | | | |
|---|---|---|---|
| 6,130,453 A | * | 10/2000 | Mei et al. .................. 257/315 |
| 6,417,049 B1 | | 7/2002 | Sung et al. |
| 6,855,979 B2 | | 2/2005 | Sadd et al. |
| 7,115,476 B1 | | 10/2006 | Izumida |
| 2006/0202255 A1 | | 9/2006 | Jeon et al. |
| 2007/0176223 A1 | | 8/2007 | Chindalore et al. |

* cited by examiner

*Primary Examiner*—H. Jey Tsai
(74) *Attorney, Agent, or Firm*—James L. Clingan, Jr.; Michael J. Balconi-Lamica (57) ABSTRACT

A self-aligned split gate bitcell includes first and second regions of charge storage material separated by a gap devoid of charge storage material. Spacers are formed along sidewalls of sacrificial layer extending above and on opposite sides of the bitcell stack, wherein the spacers are separated from one another by at least a gap length. Etching the bitcell stack, selective to the spacers, forms a gap that splits the bitcell stack into first and second gates which together form the split gate bitcell stack. A storage portion of bitcell stack is also etched, wherein etching extends the gap and separates the corresponding layer into first and second separate regions, the extended gap being devoid of charge storage material. Dielectric material is deposited over the gap and etched back to expose a top surface of the sacrificial layer, which is thereafter removed to expose sidewalls of the split gate bitcell stack.

19 Claims, 5 Drawing Sheets

SPLIT GATE MEMORY CELL USING SIDEWALL SPACERS

CROSS-REFERENCE TO RELATED APPLICATION(S)

This application is related to U.S. patent application Ser. No. 11/759,593, filed on even date, entitled "Self-Aligned Split Gate Memory Cell and Method of Forming," naming Rajesh A. Rao, Tushar P. Merchant, Ramachandran Muralidhar, and Lakshmanna Vishnubhotla as inventors, and assigned to the current assignee hereof.

BACKGROUND

1. Field

This disclosure relates generally to semiconductor devices, and more specifically, to non-volatile memories having a split gate.

2. Related Art

Non-volatile memories (NVMs) have many important uses in combination with other circuitry, especially when power may not always be applied. This can be for power loss or power savings applications. Primarily, NVMs have been floating gate devices, but floating gates have limitations, especially as geometries have gotten smaller. If there is any leakage path, regardless of how localized, to the floating gate, the charge can be completely removed from the floating gate. Thus, nanocrystals and nitride as the storage layer have become of more interest because one leakage path does not discharge the entire storage layer. One of the structures that has been shown to have much promise for programming efficiency is a split gate memory cell using source side injection in which both a control gate and a select gate influence the channel but only the control gate ever has the higher voltage needed for programming and erasing.

Known split-gate memory cell devices use two gates. A first gate is a control gate to control the program and erase operations. A second gate is a select gate to select when the memory bit is to be programmed. Such known split-gate memory cells are therefore bigger than single gate memory devices. Therefore, it is difficult to reduce dimensions of the structures that are used to implement known split-gate memory cells to take advantage of improvements in processing technology. Thus, it is desirable for a split gate cell, as well as an improved method of making such a split gate cell, in which one or more of the desirable improvements are achieved.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a material extends above the gate stack that has a wall aligned to the sidewall of the gate stack. Along this wall a sidewall spacer is formed which extends inward over the gate. This leaves a small opening over the gate stack between opposing portions of the sidewall spacer. This opening is then etched to cause the gate stack to be split into two portions to form the control gate and select gate over an active region of a non-volatile memory cell. There is no mask required to form this separation between the control gate and select gate over the active region. Thus, the control gate and select gate can have sublithographic feature sizes which has the affect of reducing cell size for a split gate as well as improving programming efficiency. This is better understood with reference to the drawings and the following description.

Figure 1:
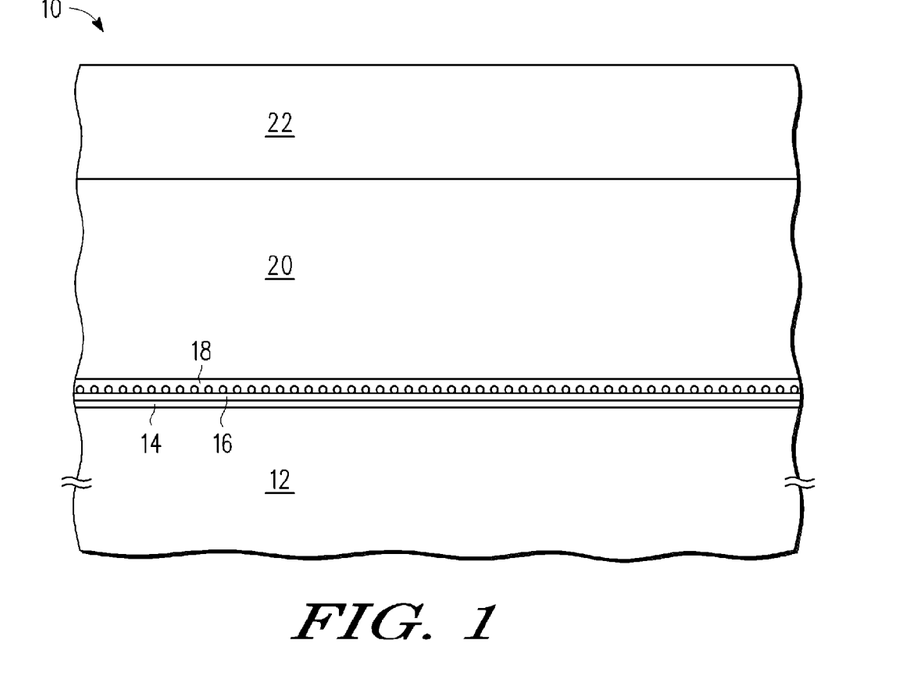
FIG. 1 is a cross section of a semiconductor device structure at a stage in processing according to one embodiment.

Shown in FIG.1 is a semiconductor device 10 comprising a substrate 12, an insulating layer 14 over substrate 12, an insulating layer 16 over insulating layer 14, a storage layer 18 over insulating layer 16, a layer 20 of gate material, and a layer 22 over layer 20. Substrate 12 is preferably silicon but could be a different semiconductor material and is shown as bulk silicon. Substrate 12 could also be a semiconductor-on-insulator (SOI) type substrate. Insulating layer 14 may be any suitable gate dielectric material such thermal oxide grown at high temperature or a high K material such as hafnium oxide. The thickness of the insulating layer 14 is relatively thin but thick enough to avoid problems with leakage. Insulating layer 16 may be a nitrogen rich oxide layer formed by decoupled plasma nitridation (DPN) which is relatively thin in this case but thick enough to be used as an etch stop when oxide is being etched. Layer 16 may not be necessary under some conditions such as when insulating layer 14 is a high k dielectric or it is not important that the gate dielectric not be etched by an oxide etch. Storage layer 18 comprises a layer of nanocrystals embedded in an insulating layer that extends above the nanocrystals. The nanocrystals are typically polysilicon of about 70 Angstroms in diameter, and the insulating layer is about 140 Angstroms in thickness. Nanocrystal is a term commonly used for a small unit of charge storage capability but is not limited to the case where the charge unit is crystalline. For example a nanocrystal could be amorphous silicon. The gate material for layer 20 may be polysilicon or metal or a combination of materials. An example of an effective thickness for layer 20 is about 1500 Angstroms. Polysilicon is preferable at this time for layer 20, but a combination of metal and overlying polysilicon is likely to become preferable. Layer 22 may be nitride. Other materials may be effective as well. Nitride is beneficial for its etch selectivity to polysilicon and oxide. A thickness of about 900 Angstroms may be used for layer 22.

Figure 2:
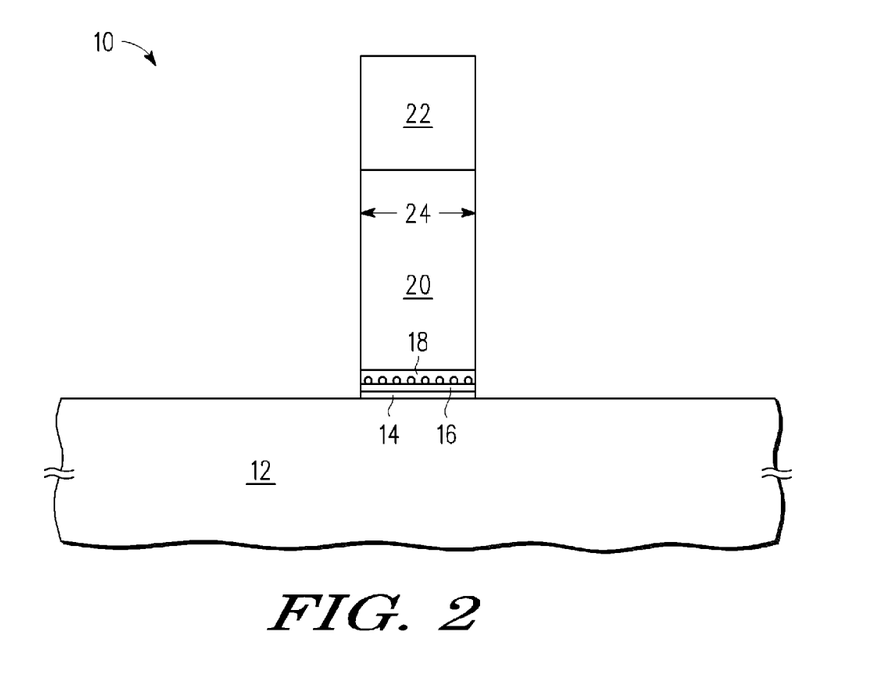
FIG. 2 is a cross section of the semiconductor device structure of FIG. 1 at a subsequent stage in processing.

Shown in FIG. 2 is semiconductor device 10 after an etch to form a gate stack having a width 24. This is a conventional gate stack etch which may be formed lithographically to minimize the width. This may be followed by a trim step to further reduce the width. Width 24 is the final width whether or not a trim step is used. In this example, width 24 is about 900 Angstroms. The etch is through layers 14, 16, 18, 20, and 22 and will require chemistry changes for the different materials being etched.

Figure 3:
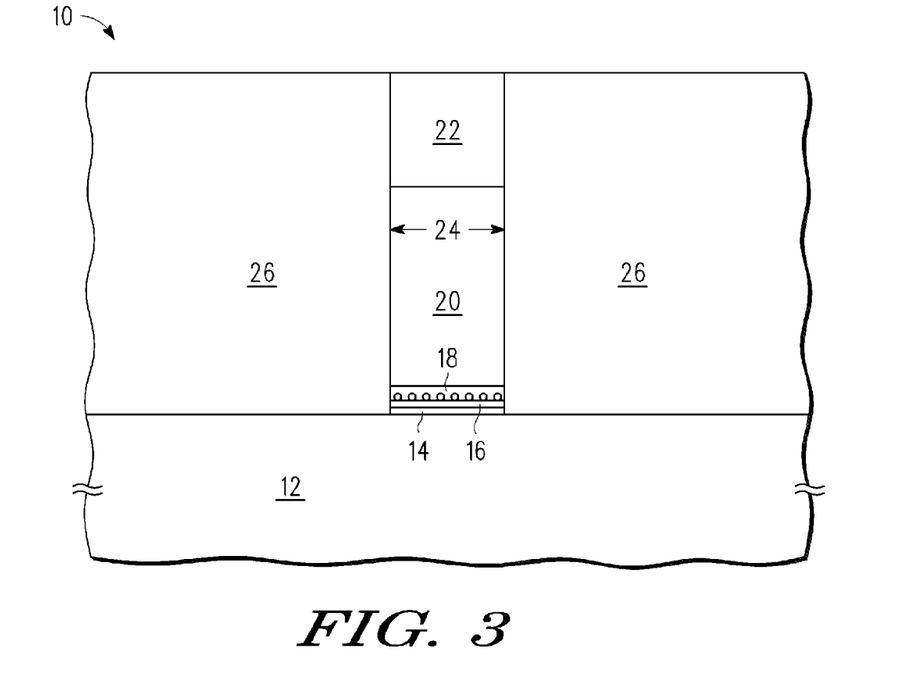
FIG. 3 is a cross section of the semiconductor device structure of FIG. 2 at a subsequent stage in processing.

Shown in FIG. 3 is semiconductor device 10 after depositing a sacrificial layer 26 and performing a step of chemical mechanical polishing (CMP). Sacrificial layer 26 may comprise silicon germanium because it is selectively etchable with regard to oxide and polysilicon and nitride is etchable selective to silicon germanium. Silicon germanium is often epitaxially grown but that is a relatively slow process and layer 26 need not be epitaxial. Other suitable materials may be effective for this purpose. The step of CMP results in the top surface of layer 22, which has been reduced in height by the CMP, being substantially coplanar with a top surface of sacrificial layer 26.

Figure 4:
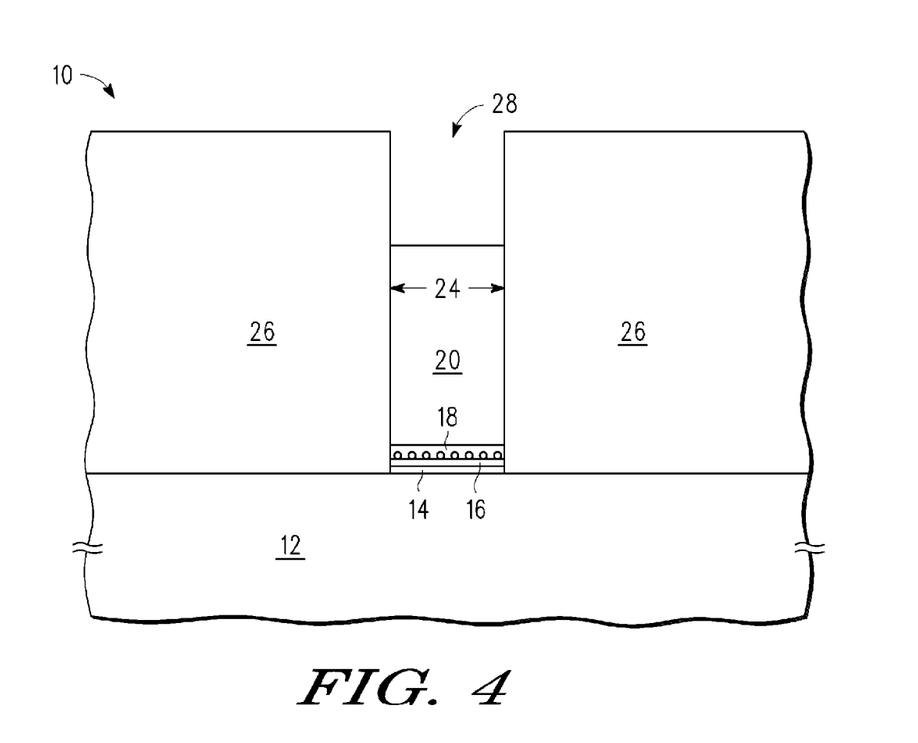
FIG. 4 is a cross section of the semiconductor device structure of FIG. 3 at a subsequent stage in processing.

Shown in FIG. 4 is semiconductor device 10 after removing layer 22 to leave an opening 28. This removal may be an etch that is selective between layer 22, layer 20, and layer 26. In this example, the etch etches nitride but selectively to polysilicon and silicon germanium. The result is that a portion of layer 26 has a sidewall exposed above a top surface of the gate stack and aligned to a side of the gate stack. As an alternative, opening 28 may be formed by performing a timed etch into layer 20 to achieve this same result.

Figure 5:
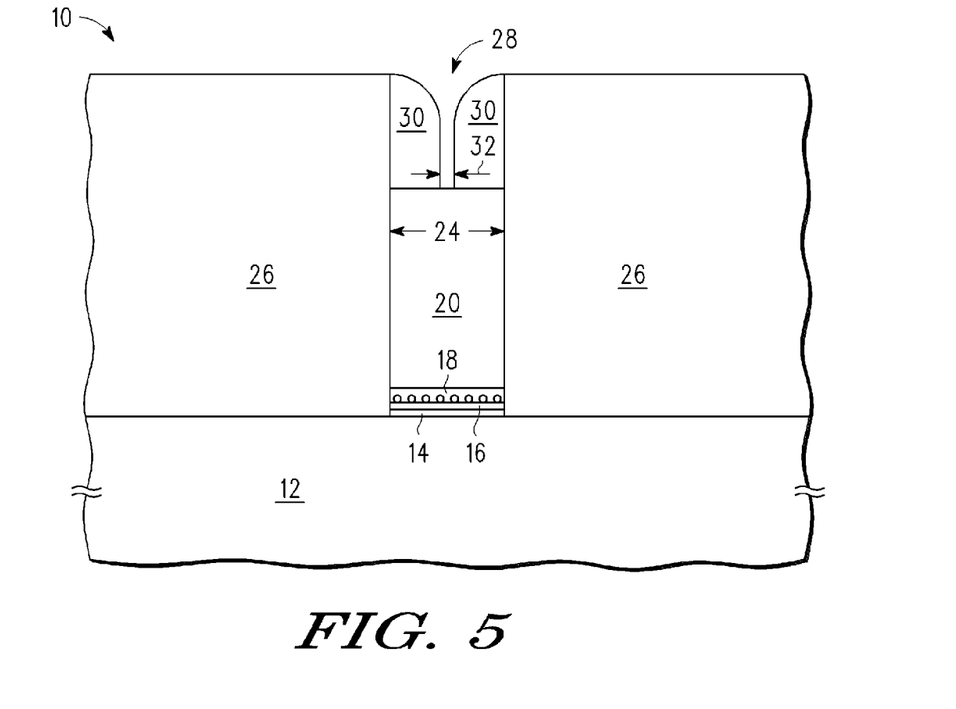
FIG. 5 is a cross section of the semiconductor device structure of FIG. 4 at a subsequent stage in processing.

Shown in FIG. 5 is semiconductor device 10 after forming a sidewall spacer 30 on the exposed sidewall layer 26 in opening 28. Portions of sidewall spacer 30 opposite each other are separated by a distance 32. This distance is adjustable by adjusting the formation of sidewall spacer 30. The formation of sidewall spacer 30 can be tuned to achieve the desired distance 32. For example, sidewall spacer 30 can be formed in multiple layers. For example, a first sidewall spacer may be formed and then another sidewall spacer may be formed to achieve the desired distance 32. In this example, distance 32 is preferably about 100 to 300 Angstroms. Sidewall spacers 30 may be formed of oxide in the manner common for oxide sidewall spacers.

Figure 6:
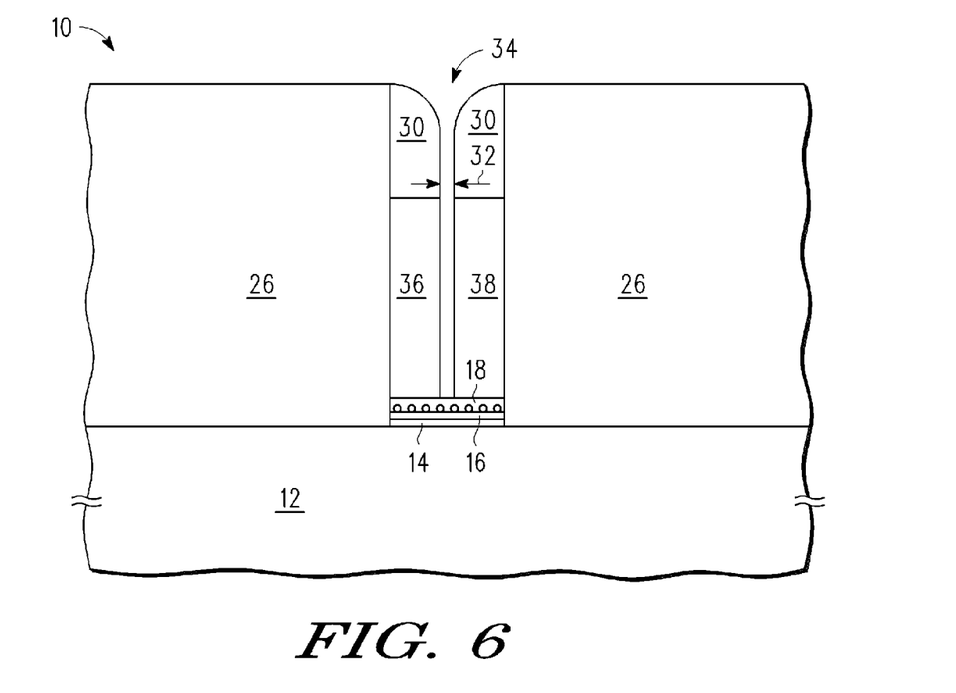
FIG. 6 is a cross section of the semiconductor device structure of FIG. 5 at a subsequent stage in processing.

Shown in FIG. 6 is semiconductor device 10 after etching through layer 20 using sidewall spacer 30 as a mask to forming opening 34. Since layer 20 is etched selective to oxide, the etch can be endpoint controlled to stop when the underlying oxide is exposed. With the formation of opening 34, layer 20 is separated into a select gate 36 and a control gate 38. Due to the symmetry, the functions of control and select gate may be reversed. Opening 34 is shown having vertical walls but these may be sloped. The slope is adjustable by altering the etch conditions so it has an isotropic component.

Figure 7:
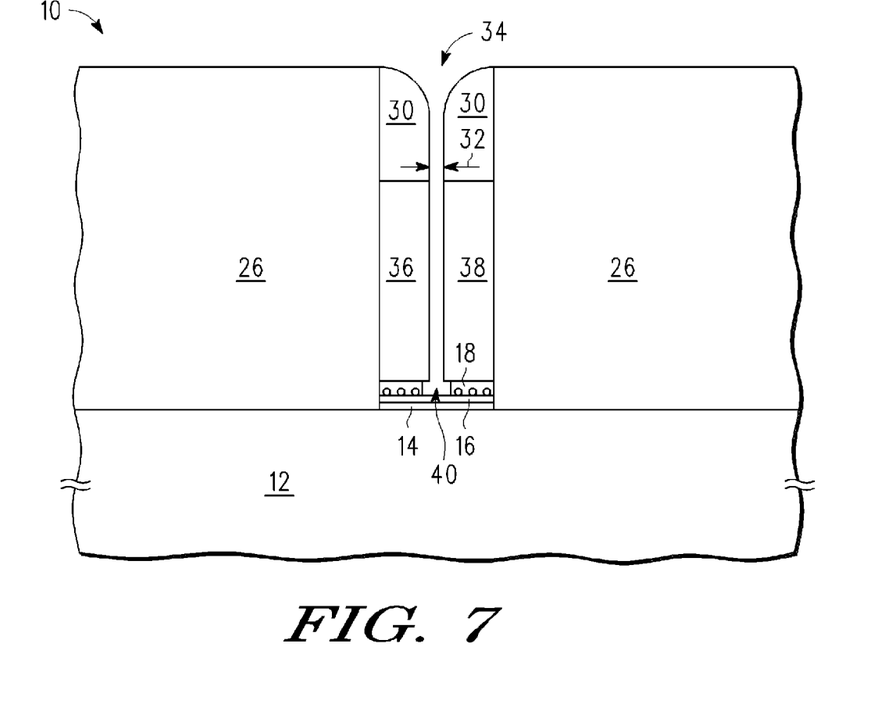
FIG. 7 is a cross section of the semiconductor device structure of FIG. 6 at a subsequent stage in processing.

Shown in FIG. 7 is semiconductor device 10 after etching into layer 28 with an isotropic etch so that nanocrystals are removed from underneath a corner of the control gate forming an opening 40 in storage layer 18, which is shown as being wider than width 32 in this example of opening 34 having vertical sidewalls. A nanocrystal at the bottom corner of the control gate adjacent to the gap has been found to be difficult to erase after it has been programmed. Thus it is desirable to not have nanocrystals at the corner of the control gate in the gap between select gate 36 and control gate 38. Layer 16 acts as an etch stop to this etch of storage layer 18. This preserves layer 14 which typically has been formed in a manner to minimize leakage. If the leakage issue can be solved in a different way such as with a subsequent deposition of a low leakage dielectric or by re-oxidation of substrate 12 in the gap, then layer 16 may not be necessary and the etch of nanocrystal layer 18 may also etch through layer 14.

Figure 8:
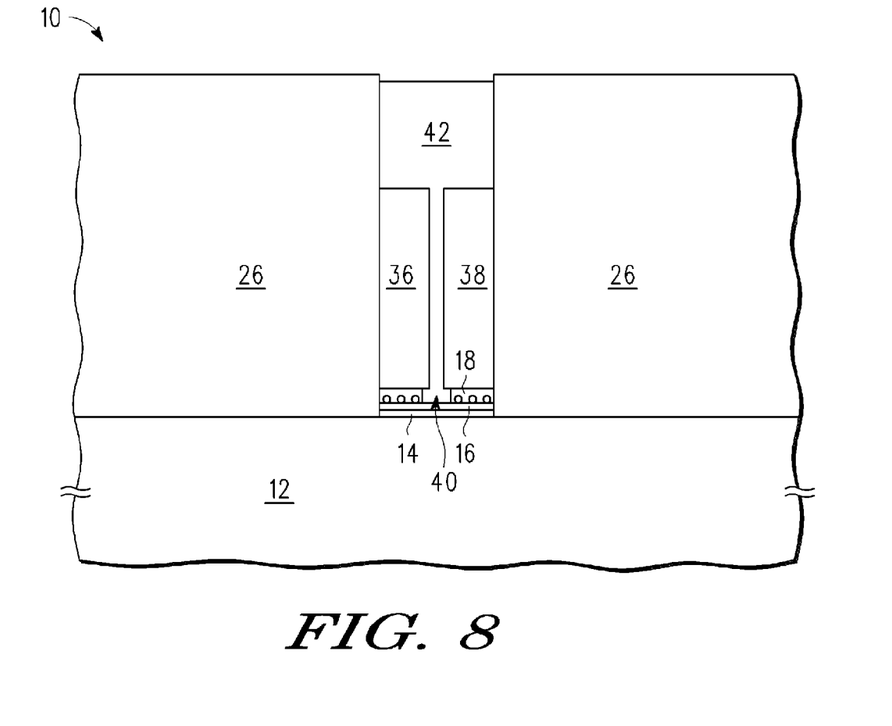
FIG. 8 is a cross section of the semiconductor device structure of FIG. 7 at a subsequent stage in processing.

Shown in FIG. 8 is semiconductor device 10 after formation of a layer 42 that fills opening 34. Layer 42 is preferably formed by depositing oxide by a high temperature oxide (HTO) using a chemical vapor deposition process that has good gap filling properties followed by an etch back. This process has the affect of merging sidewall spacer 30 with the deposited layer so that it is substantially a continuous layer of oxide filling openings 34 and 40 as well as substantially filling opening 28 which was formed as shown in FIG. 4. Sidewall spacer 30 may be removed before the deposition that fills opening 34. Another alternative is to cap opening 34 and leaving opening 34 as an air gap between select gate 36 and control gate 38. Also instead of depositing oxide, a low k dielectric material may be deposited such as silicon carbon oxygen hydrogen (SiCOH) and fluorosilicate glass.

Figure 9:
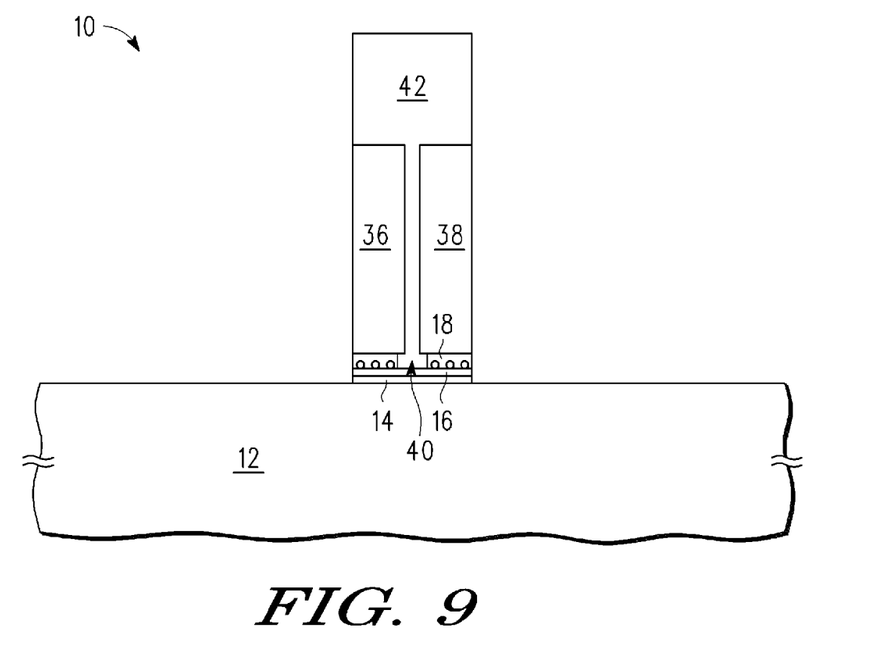
FIG. 9 is a cross section of the semiconductor device structure of FIG. 8 at a subsequent stage in processing.

Shown in FIG. 9 is semiconductor device 10 after removing layer 26. An etch of silicon germanium that is selective to oxide and silicon may be used. One etch chemistry for this is the common etch known as an RCA clean which comprises ammonium hydroxide, hydrogen peroxide, and water for the primary removal followed by hydrochloric acid and hydrogen peroxide and water completing the cleaning process. Other etches may be effective for this as well. The silicon germanium of layer 26 is beneficial because it can be etched selective to oxide and silicon. It is also beneficial because it is selective to an etch of nitride. Other materials may be found to be useful in place of this example of one or more of silicon for substrate 12, oxide for layer 42, polysilicon for select gate 36 and control gate 38, and nitride for layer 22. In such case other etch considerations would be relevant. Also another material having the desired etch selectivity characteristics may be found in material other than silicon germanium that may be found to be useful.

Figure 10:
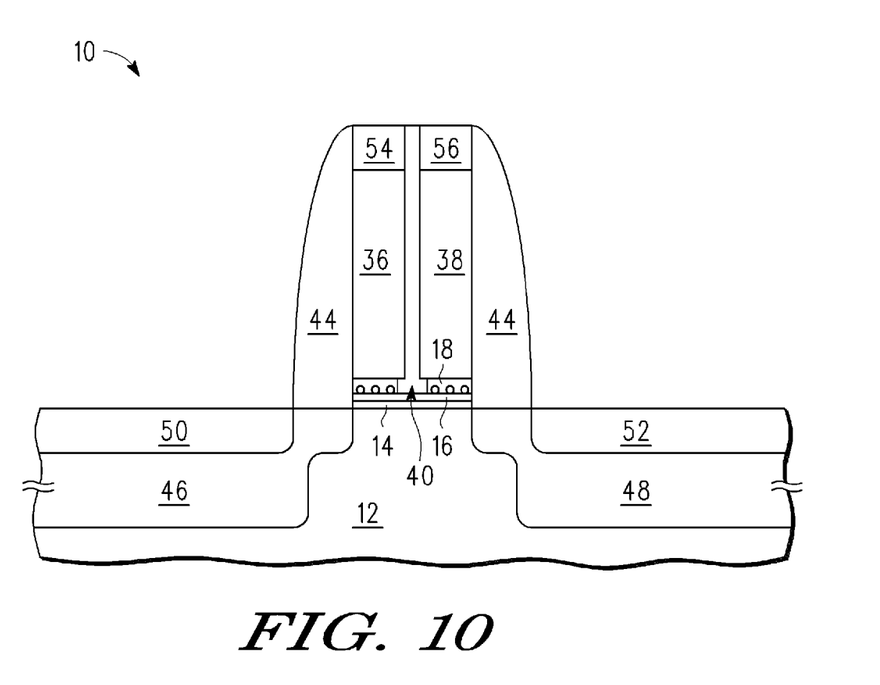
FIG. 10 is a cross section of the semiconductor device structure of FIG. 9 at a subsequent stage in processing.

Shown in FIG. 10 is semiconductor device 10 after the steps for a completed NVM cell from that of FIG. 9. This includes forming a sidewall spacer 44 around control and select gates 36 and 38, which may be a composite of liners and sidewall spacers, a source/drain region 46 on a side of select gate 36 away from control gate 38, a source/drain region 48 in substrate 12 on a side of control gate 38 away from select gate 36, a silicide region 50 in a top region of source/drain 46, a silicide region 52 on a top portion of source/drain region 48, a silicide region 54 on a top surface of select gate 36, and a silicide region 56 on a top portion of control gate 38.

The contacts to select gate 36 and control gate 38 are made outside of the active region where the NVM cell is formed. Gate contacts are nearly always formed outside the active area. The gate extension outside the active area is widened substantially from the gate that is over the active region. In the case of a memory array where the memory cell shown in FIG. 10 would be just one of many memory cells in the array, there would be many control gates connected together for each control gate contact and many select gates connected together for each select gate contact. Also in the case of semiconductor device 10 of FIG. 10, which is the NVM cell, the control gate and select gate would be separated by an etch at the contact pad that would cause these two gate types to be separated. This etch, which would be non-critical etch, could be performed at almost any stage, but preferably before source/drain formation.

The presence of nanocrystals under the select gate 36 does not adversely impact the operation of the semiconductor device 10 because the select gate is never exposed to the high voltages required to inject charges into the nanocrystals during normal operation of the device. As a result, the nanocrystals under the select gate do not influence the threshold voltage of the channel under the select gate. If needed, however, the nanocrystals under the select gate may be programmed by intentionally biasing the select gate 36 to high voltages. This provides an additional means to modulate the select gate threshold voltage. In contrast the nanocrystals under the control gate 38 may be programmed by charge injection from the channel portion under the control gate when a high voltage is applied to the control gate as is done during a program operation of the memory device. These nanocrystals perform the function of a charge storage element in the memory device thereby influencing the threshold voltage of the second portion of the channel under the control gate.

The semiconductor substrate described herein can be any semiconductor material or combinations of materials, such as gallium arsenide, silicon germanium, silicon-on-insulator (SOI), silicon, monocrystalline silicon, the like, and combinations of the above. a semiconductor layer thus can be considered, for example, a bulk semiconductor substrate or a top semiconductor layer of an SOI substrate.

By now it should be appreciated that there has been provided a method of forming a split gate memory device comprising providing a semiconductor layer, providing a bitcell stack overlying the semiconductor layer, providing a sidewall spacer height determining layer overlying the bitcell stack, defining a bitcell length, forming a sacrificial layer, planarizing the sacrificial layer, removing the sidewall spacer height determining layer, forming sidewall spacers, etching a third layer, etching through a second layer, depositing a dielectric material and performing an etch back, and removing the sacrificial layer. The bitcell stack includes at least a first layer, a second layer, and a third layer, wherein the second layer comprises a charge storage material. The bitcell length is defined within the bitcell stack and the sidewall spacer height determining layer, wherein defining also includes exposing the semiconductor layer on opposing sides of the bitcell stack defined by the bitcell length, the bitcell length including a first gate length, a second gate length, and a gap length of a split gate bitcell. The sacrificial layer is formed over the bitcell stack and the exposed portions of the semiconductor layer, and the sacrificial layer is selectively etchable with respect to the bitcell stack. The planarizing the sacrificial layer exposes a surface of the sidewall spacer height determining layer overlying the bitcell stack. The removing the sidewall spacer height determining layer exposes sidewall portions of the sacrificial layer. The sidewall spacers are formed along the exposed sidewall portions of the sacrificial layer, wherein bottom portions of the sidewall spacers proximate the third layer of the bitcell stack are separated from one another by at least the gap length. The third layer of the bitcell stack is etched selective to the sidewall spacers, wherein the etching forms a gap within the third layer that splits the third layer into a first gate and a second gate which together form a split gate bitcell stack. The dielectric material is deposited over the gap, and the etch back exposes a top surface of the sacrificial layer. Removing the sacrificial layer exposes sidewalls of the split gate bitcell stack. The first layer may comprise tunnel oxide having a decoupled plasma nitridation at a top surface of the tunnel oxide. The charge storage layer may comprise nanocrystals and high temperature oxide. The third layer may comprise a gate electrode material of at least one selected from polysilicon and metal. The sidewall spacer height determining layer may comprise nitride. The bitcell length may be defined via a bitcell etch of the bitcell stack. The sacrificial layer may comprise silicon germanium. One of the first and second separate regions of the second layer may function as a storage region of the split gate bitcell stack. The etching through the second layer may include stopping the etching on the first layer of the bitcell stack. The etching through the second layer further may include etching through the first layer and stopping the etching on the semiconductor layer.

The etching back may recess a top surface of the dielectric material below a top surface of the sacrificial layer. The depositing the dielectric material over the gap may include filling the gap with the dielectric material. The dielectric material may comprise a low-k dielectric having a dielectric constant less than three. The dielectric material may comprise at least one selected from the group consisting of a high temperature oxide, SiCOH, and fluorosilicate glass. One of the first gate and second gate may comprise a select gate and the other of the first gate and the second gate may comprise a control gate. The first gate may comprise a select gate, the second gate may comprise a control gate, and the bitcell length may be on the order of 90 nm.

A further method of forming a split gate memory device is described. The includes providing a semiconductor layer. The method further includes providing a bitcell stack overlying the semiconductor layer, wherein the bitcell stack includes at least a first layer, a second layer, and a third layer, wherein the second layer comprises a charge storage material of nanocrystals and high temperature oxide. The method further includes providing a sidewall spacer height determining layer overlying the bitcell stack. The method further includes defining a bitcell length within the bitcell stack and the sidewall spacer height determining layer, wherein defining also includes exposing the semiconductor layer on opposing sides of the bitcell stack defined by the bitcell length, the bitcell length including a first gate length, a second gate length, and a gap length of a split gate bitcell. The method further includes forming a sacrificial layer over the bitcell stack and the exposed portions of the semiconductor layer, the sacrificial layer being selectively etchable with respect to the bitcell stack. The method further includes planarizing the sacrificial layer to expose a surface of the sidewall spacer height determining layer overlying the bitcell stack. The method further includes removing the sidewall spacer height determining layer overlying the bitcell stack, wherein removing the sidewall spacer height determining layer exposes sidewall portions of the sacrificial layer. The method further includes forming sidewall spacers along the exposed sidewall portions of the sacrificial layer, wherein bottom portions of the sidewall spacers proximate the third layer of the bitcell stack are separated from one another by at least the gap length. The method further includes etching the third layer of the bitcell stack selective to the sidewall spacers, wherein the etching forms a gap within the third layer that splits the third layer into a first gate and a second gate which together form a split gate bitcell stack. The method further includes etching through the second layer of the bitcell stack, wherein the etching extends the gap and separates the second layer into first and second separate regions of the split gate bitcell stack, the extended gap being devoid of charge storage material, and wherein one of the first and second separate regions of the second layer functions as a storage region of the split gate bitcell stack. The method further includes depositing a dielectric material over the gap and performing an etch back of the dielectric material to expose a top surface of the sacrificial layer. The method further includes removing the sacrificial layer to expose sidewalls of the split gate bitcell stack. The depositing the dielectric material over the gap may include filling the gap with the dielectric material. The dielectric material may comprise at least one selected from the group consisting of a high temperature oxide, SiCOH, and fluorosilicate glass. Also described is a split gate device formed by the method.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, an RCA clean was used for removing a silicon germanium layer but another etch may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a split gate memory device, comprising:
   providing a semiconductor layer;
   providing a bitcell stack overlying the semiconductor layer, wherein the bitcell stack includes at least a first layer, a second layer, and a third layer, wherein the second layer comprises a charge storage material;
   providing a sidewall spacer height determining layer overlying the bitcell stack;
   defining a bitcell length within the bitcell stack and the sidewall spacer height determining layer, wherein defining also includes exposing the semiconductor layer on opposing sides of the bitcell stack defined by the bitcell length, the bitcell length including a first gate length, a second gate length, and a gap length of a split gate bitcell;
   forming a sacrificial layer over the bitcell stack and the exposed portions of the semiconductor layer, the sacrificial layer being selectively etchable with respect to the bitcell stack;
   planarizing the sacrificial layer to expose a surface of the sidewall spacer height determining layer overlying the bitcell stack;
   removing the sidewall spacer height determining layer overlying the bitcell stack, wherein removing the sidewall spacer height determining layer exposes sidewall portions of the sacrificial layer;
   forming sidewall spacers along the exposed sidewall portions of the sacrificial layer, wherein bottom portions of the sidewall spacers proximate the third layer of the bitcell stack are separated from one another by at least the gap length;
   etching the third layer of the bitcell stack selective to the sidewall spacers, wherein the etching forms a gap within the third layer that splits the third layer into a first gate and a second gate which together form a split gate bitcell stack;
   etching through the second layer of the bitcell stack, wherein the etching extends the gap and separates the second layer into first and second separate regions of the split gate bitcell stack, the extended gap being devoid of charge storage material;
   depositing a dielectric material over the gap and performing an etch back of the dielectric material to expose a top surface of the sacrificial layer; and
   removing the sacrificial layer to expose sidewalls of the split gate bitcell stack.

2. The method of claim 1, wherein the first layer comprises tunnel oxide having a decoupled plasma nitridation at a top surface of the tunnel oxide.

3. The method of claim 1, wherein the charge storage layer comprises nanocrystals and high temperature oxide.

4. The method of claim 1, wherein the third layer comprises a gate electrode material of at least one selected from polysilicon and metal.

5. The method of claim 1, wherein the sidewall spacer height determining layer comprises nitride.

6. The method of claim 1, wherein the bitcell length is defined via a bitcell etch of the bitcell stack.

7. The method of claim 1, wherein the sacrificial layer comprises silicon germanium.

8. The method of claim 1, wherein one of the first and second separate regions of the second layer functions as a storage region of the split gate bitcell stack.

9. The method of claim 1, wherein etching through the second layer includes stopping the etching on the first layer of the bitcell stack.

10. The method of claim 1, wherein etching through the second layer further includes etching through the first layer and stopping the etching on the semiconductor layer.

11. The method of claim 1, further wherein etching back recesses a top surface of the dielectric material below a top surface of the sacrificial layer.

12. The method of claim 1, wherein depositing the dielectric material over the gap includes filling the gap with the dielectric material.

13. The method of claim 1, wherein the dielectic material comprises a low-k dielectric having a dielectric constant less than three.

14. The method of claim 1, wherein the dielectric material comprises at least one selected from the group consisting of a high temperature oxide, SiCOH, and fluorosilicate glass.

15. The method of claim 1, wherein one of the first gate and second gate comprises a select gate and the other of the first gate and the second gate comprises a control gate.

16. The method of claim 1, wherein the first gate comprises a select gate, the second gate comprises a control gate, and the bitcell length is on the order of 90 nm.

17. A method of forming a split gate memory device, comprising:
   providing a semiconductor layer;
   providing a bitcell stack overlying the semiconductor layer, wherein the bitcell stack includes at least a first layer, a second layer, and a third layer, wherein the second layer comprises a charge storage material of nanocrystals and high temperature oxide;
   providing a sidewall spacer height determining layer overlying the bitcell stack;
   defining a bitcell length within the bitcell stack and the sidewall spacer height determining layer, wherein defining also includes exposing the semiconductor layer on opposing sides of the bitcell stack defined by the bitcell length, the bitcell length including a first gate length, a second gate length, and a gap length of a split gate bitcell;

forming a sacrificial layer over the bitcell stack and the exposed portions of the semiconductor layer, the sacrificial layer being selectively etchable with respect to the bitcell stack;

planarizing the sacrificial layer to expose a surface of the sidewall spacer height determining layer overlying the bitcell stack;

removing the sidewall spacer height determining layer overlying the bitcell stack, wherein removing the sidewall spacer height determining layer exposes sidewall portions of the sacrificial layer;

forming sidewall spacers along the exposed sidewall portions of the sacrificial layer, wherein bottom portions of the sidewall spacers proximate the third layer of the bitcell stack are separated from one another by at least the gap length;

etching the third layer of the bitcell stack selective to the sidewall spacers, wherein the etching forms a gap within the third layer that splits the third layer into a first gate and a second gate which together form a split gate bitcell stack;

etching through the second layer of the bitcell stack, wherein the etching extends the gap and separates the second layer into first and second separate regions of the split gate bitcell stack, the extended gap being devoid of charge storage material, and wherein one of the first and second separate regions of the second layer functions as a storage region of the split gate bitcell stack;

depositing a dielectric material over the gap and performing an etch back of the dielectric material to expose a top surface of the sacrificial layer; and removing the sacrificial layer to expose sidewalls of the split gate bitcell stack.

18. The method of claim 17, wherein depositing the dielectric material over the gap includes filling the gap with the dielectric material.

19. The method of claim 17, wherein the dielectric material comprises at least one selected from the group consisting of a high temperature oxide, SiCOH, and fluorosilicate glass.

* * * * *